United States Patent
Liu

(10) Patent No.: US 7,922,365 B2
(45) Date of Patent: Apr. 12, 2011

(54) LED ILLUMINATING DEVICE AND LIGHT ENGINE THEREOF

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 130 days.

(21) Appl. No.: 12/486,720

(22) Filed: Jun. 17, 2009

(65) Prior Publication Data

US 2010/0172144 A1  Jul. 8, 2010

(30) Foreign Application Priority Data

Jan. 5, 2009  (CN) .......................... 2009 1 0300046

(51) Int. Cl.
*F21V 29/00* (2006.01)

(52) U.S. Cl. ........ 362/294; 362/101; 362/645; 362/373; 362/311.03

(58) Field of Classification Search .................. 362/294, 362/373, 101, 96, 640, 645, 650
See application file for complete search history.

(56) References Cited

U.S. PATENT DOCUMENTS

| 7,674,012 | B1 * | 3/2010 | Lin et al. | 362/249.02 |
| 2008/0055908 | A1 * | 3/2008 | Wu et al. | 362/294 |
| 2008/0055909 | A1 * | 3/2008 | Li | 362/294 |
| 2009/0109671 | A1 * | 4/2009 | Yu et al. | 362/234 |
| 2009/0116233 | A1 * | 5/2009 | Zheng et al. | 362/234 |
| 2009/0244892 | A1 * | 10/2009 | Xie et al. | 362/236 |
| 2009/0310349 | A1 * | 12/2009 | Xiang et al. | 362/234 |

* cited by examiner

*Primary Examiner* — Ali Alavi
(74) *Attorney, Agent, or Firm* — Frank R. Niranjan

(57) ABSTRACT

An LED illuminating device includes an optical section, an electrical section, and a heat dissipation section provided with a heat dissipation device. The heat dissipation device includes a hollow metal tube, a bottom cover plate and a top cover plate respectively sealing a bottom and a top of the metal tube, and a tubular member received in the metal tube and axially defining a vapor passage channel therethrough. A condensate passage channel is defined between the metal tube and the tubular member. An evaporating chamber is defined between the bottom of the tubular member and the bottom cover plate. A condensing chamber is defined between a top of the tubular member and the top cover plate. First and second porous wicks are in the metal tube and attached to the bottom cover plate and the condensate passage channel respectively. A working fluid is saturated in the first porous wick.

18 Claims, 5 Drawing Sheets

LED ILLUMINATING DEVICE AND LIGHT ENGINE THEREOF

CROSS-REFERENCE TO RELATED APPLICATION

This application is related to a co-pending U.S. patent application entitled "LED ILLUMINATION DEVICE AND LIGHT ENGINE THEREOF" Ser. No. 12/486,719 and filed in the same day as the instant application. The co-pending U.S. patent application is assigned to the same assignee as the instant application. The disclosure of the above-identified application is incorporated herein by reference.

BACKGROUND

1. Technical Field

The present disclosure generally relates to light emitting diode (LED) illuminating devices, and particularly to an LED illuminating device with a high heat dissipating efficiency and a light engine of the LED illuminating device.

2. Description of Related Art

In recent years, LEDs (light emitting diodes) are preferred for use in LED illuminating devices rather than CCFLs (cold cathode fluorescent lamps) and other traditional lamps due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs is generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks, can no longer satisfy the heat dissipation requirement of the high brightness LED illuminating device.

Therefore, it is desirable to provide an LED illuminating device with a high heat dissipating efficiency.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
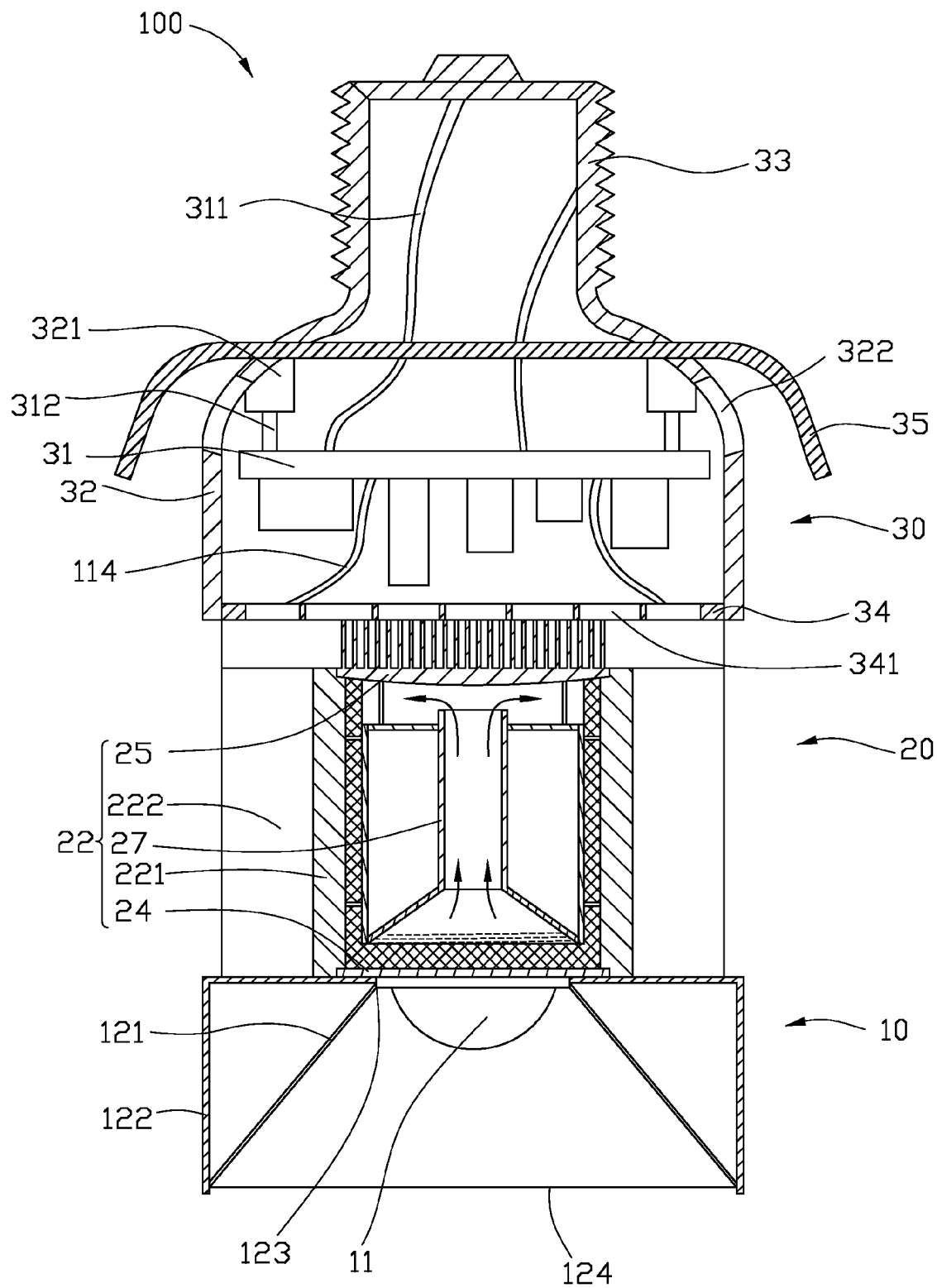
FIG. 1 is a cross-sectional view of an LED illuminating device in accordance with an exemplary embodiment.

Reference will now be made to the drawing figures to describe the present disclosure in detail.

FIG. 1 is a cross-sectional view of an LED illuminating device 100 in accordance with an embodiment of the present disclosure. The LED illuminating device 100 includes an optical section 10, an electrical section 30, and a heat dissipation section 20 arranged between the optical section 10 and the electrical section 30. The LED illuminating device 100 is substantially cylindrical. The optical section 10 is located at a front end of the LED illuminating device 100, while the electrical section 30 is located at a rear end of the LED illuminating device 100.

The optical section 10 includes a housing 122, a light reflector 121, a light source 11, and an optical lens 124. A rear end of the housing 122 is coupled to the heat dissipation section 20, and a front end of the housing 122 is provided with the optical lens 124. The light reflector 121 and the light source 11 are received in the housing 122. The housing 122 provides protection for the light source 11 and the light reflector 121. The light reflector 121 is cone-shaped and tapers from the front end towards the rear end of the housing 122. The light reflector 121 has a rear end located adjacent to the heat dissipation section 20, and a front end mounted to the front end of the housing 122. The light reflector 121 and the optical lens 124 provide luminescence characteristics for the light source 11. An opening 123 is defined at the rear end of the light reflector 121 and the light source 11 is mounted at the opening 123 and thermally attached to the heat dissipation section 20. Light emitted by the light source 11 is reflected and guided by the light reflector 121 to an outside of the optical section 10 through the optical lens 124.

The electrical section 30 provides drive power, control circuit and power management for the light source 11. The electrical section 30 includes a casing 32 having a front end connected with the heat dissipation section 20, a lamp head 33 connected with a rear end of the casing 32, a partition plate 34 mounted at the front end of the casing 32, and a circuit board 31 received in the casing 32. A plurality of air passage holes 322 are radially defined through the casing 32 at a position corresponding to the circuit board 31. A dustproof cover 35 is provided over the air passage holes 322 for preventing dust from entering into an interior of the electrical section 30. The air passage holes 322 communicate the interior of the electrical section 30 with an outside environment and are utilized for dissipating heat of the circuit board 31. The partition plate 34 partitions the heat dissipation section 20 from the electrical section 30. The partition plate 34 is defined with a plurality of air passage openings 341 which communicate the heat dissipation section 20 with the electrical section 30.

The circuit board 31 is mounted in the casing 32 of the electrical section 30 via a plurality of mounting seats 321 and a plurality of mounting poles 312. The mounting seats 321 are attached to an inner surface of the casing 32. The mounting poles 312 connect the circuit board 31 with the mounting seats 321. The electrical section 30 is further provided with a plurality of electrical wires 114, 311 electrically connected with the circuit board 31. The electrical wires 114 extend through the partition plate 34 and electrically connect with the light source 11. The electrical wires 311 electrically connect with the lamp head 33, whereby the LED illuminating device 100 can get power from an external power source via the lamp head 33.

Figure 2:
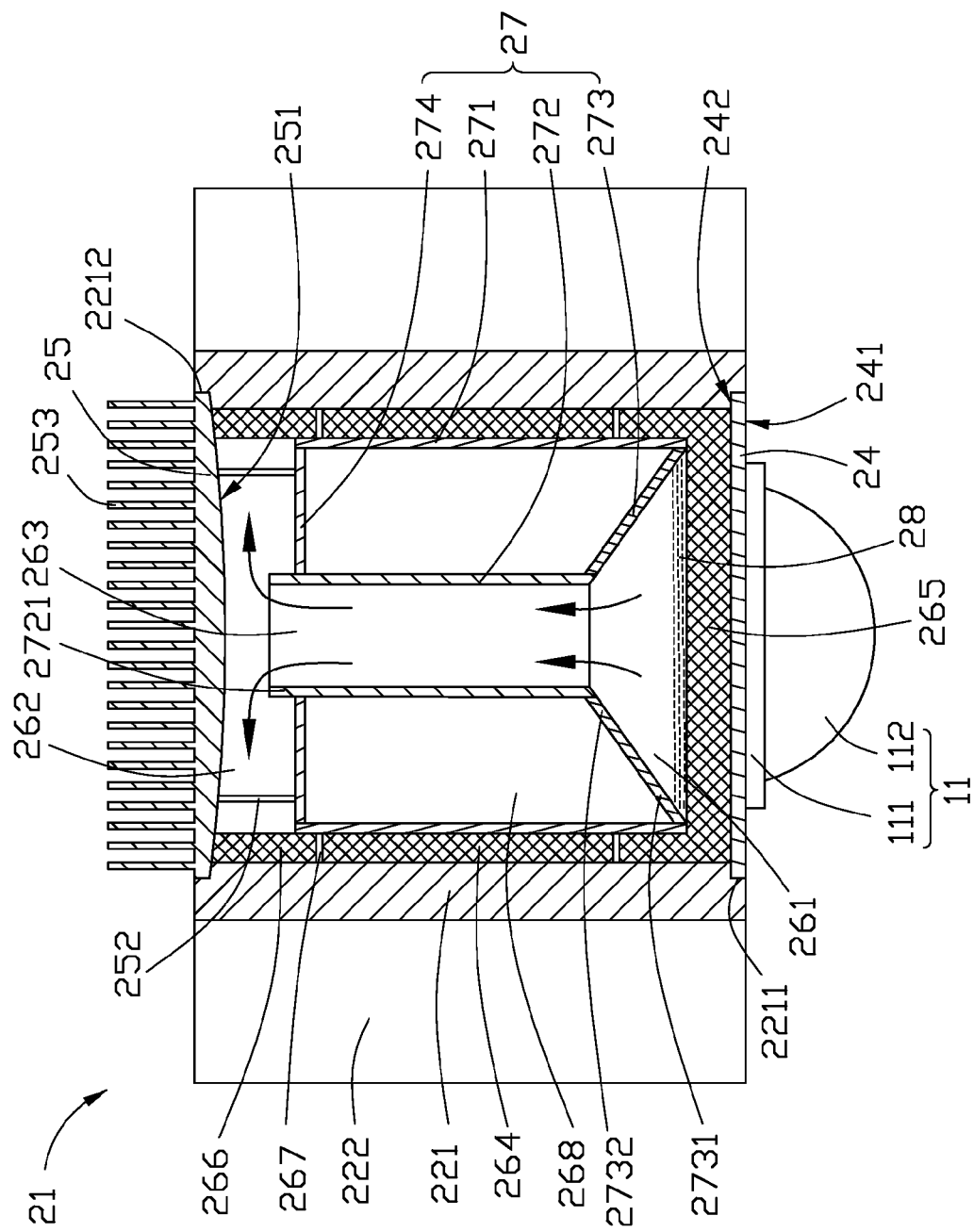
FIG. 2 shows a light engine of the LED illuminating device of FIG. 1.
Figure 3:
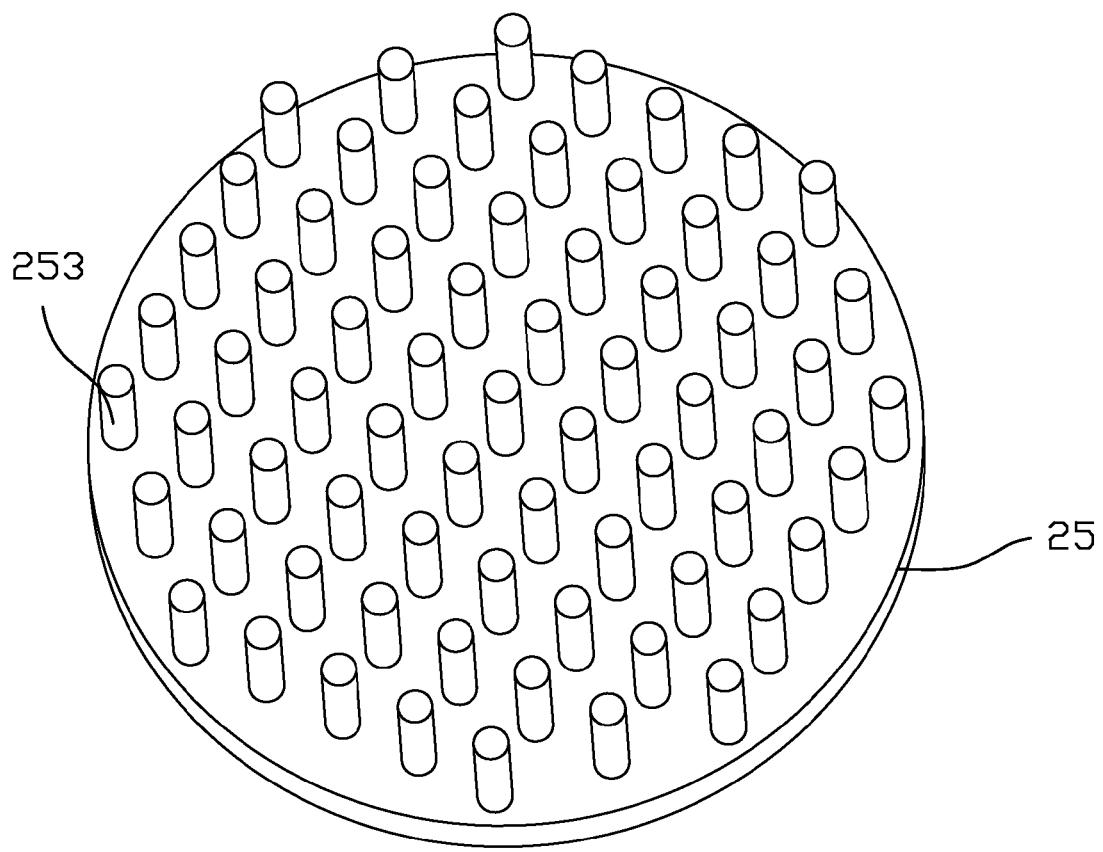
FIG. 3 is an isometric view of a top cover plate of the light engine of FIG. 2.

The heat dissipation section 20 is provided with a heat dissipation device 22. Referring also to FIGS. 2-3, the heat dissipation device 22 and the light source 11 cooperatively form a light engine 21 for the LED illuminating device 100. The heat dissipation device 22 includes a cylindrical hollow metal tube 221, a plurality of plate-shaped, metal fins 222 extending radially outwardly from an outer circumferential surface of the metal tube 221, a bottom cover plate 24 hermetically sealing a bottom of the metal tube 221, a top cover plate 25 hermetically sealing a top of the metal tube 221, and a tubular member 27 received in the metal tube 221. An annular groove 2211 is defined in the bottom of the metal tube 221, and an outer periphery of the bottom cover plate 24 is fixedly embedded in the annular groove 2211. An annular groove 2212 is defined in the top of the metal tube 221, and an outer periphery of the top cover plate 25 is fixedly embedded in the annular groove 2212. A plurality of pin-shaped, metal fins 253 extends upwardly from the top cover plate 25.

The tubular member 27 is coaxially arranged with the metal tube 221. A bottom of the tubular member 27 is spaced from the bottom cover plate 24, with an evaporating chamber 261 defined between the bottom of the tubular member 27 and the bottom cover plate 24. A first porous wick 265 is received in the evaporating chamber 261 and attached to an inner surface 242 of the bottom cover plate 24. A working fluid 28 such as water, alcohol is filled in the evaporating chamber 261 and saturated in the first porous wick 265. The heat dissipation device 22 employs a phase change of the working fluid 28 in the metal tube 221 to actively dissipate heat generated by the light source 11.

A vapor passage channel 263 is axially defined through a central portion of the tubular member 27 for passage of vapor. A top of the tubular member 27 is spaced from the top cover plate 25, with a condensing chamber 262 defined between the top of the tubular member 27 and the top cover plate 25. The top cover plate 25 has an inner surface 251 facing the condensing chamber 262. The tubular member 27 has a diameter smaller than the metal tube 221, with a condensate passage channel 264 defined between the metal tube 221 and the tubular member 27. The vapor passage channel 263 fluidically connects the evaporating chamber 261 with the condensing chamber 262 at an inner center of the tubular member 27. The condensate passage channel 264 fluidically connects the condensing chamber 262 with the evaporating chamber 261 at an outer periphery of the tubular member 27. A second porous wick 266 is filled in the condensate passage channel 264. Two ends of the second porous wick 266 are connected with the first porous wick 265 and the top cover plate 25, respectively. The porous wick 265, 266 are selected from one of screen mesh, sintered powder, fiber, metal foam, and tiny grooves.

Particularly, the tubular member 27 includes an outer tube 271, an inner tube 272, a bottom plate 273, and a top plate 274. Each of the inner tube 272 and the outer tube 271 is cylindrical. The outer tube 271 has a diameter greater than the inner tube 272 but smaller than the metal tube 221. The inner tube 272, the outer tube 271 and the metal tube 221 are coaxial. The vapor passage channel 263 is enclosed by the inner tube 272. The condensate passage channel 264 is defined between an inner circumferential surface of the metal tube 221 and an outer circumferential surface of the outer tube 271. The condensate passage channel 264 is annular in profile and extends axially along an axial direction of the metal tube 221. The evaporating chamber 261 is defined between the bottom plate 273 and the bottom cover plate 24. The condensing chamber 262 is defined between the top plate 274 and the top cover plate 25.

In the present embodiment, the inner tube 272, the outer tube 271, the bottom plate 273 and the top plate 274 are assembled together to form the tubular member 27, with an annular, hollow chamber 268 defined between the inner tube 272 and the outer tube 271. Alternatively, the tubular member 27 can be simply formed as a tube having only a central hole functioning as the vapor passage channel 263, without the hollow chamber 268 defined between the inner tube 272 and the outer tube 271, whereby an assembly process for connecting the inner tube 272, the outer tube 271, the top plate 274 and the bottom plate 273 can be eliminated.

The tubular member 27 is fixedly mounted in the metal tube 221 via a plurality of mounting poles 252, 267, wherein the mounting poles 252 are disposed in the condensing chamber 262 and connect the top plate 274 with the top cover plate 25, and the mounting poles 267 are disposed in the condensate passage channel 264 and connect the outer tube 271 with the metal tube 221.

The light source 11 is attached to an outer surface 241 of the bottom cover plate 24, whereby heat generated by the light source 11 is transferred to and effectively dissipated by the heat dissipation device 22. The light source 11 includes a substrate 111 forming electrical circuits (not shown) thereon, and at least one LED 112 (light emitting diode) arranged on the substrate 111 and electrically connected to electrical circuits. The substrate 111 is attached to the outer surface 241 of the bottom cover plate 24. The LED 112 is electrically connected with the electrical wires 114 of the electrical section 30. Alternatively, the electrical circuits formed on the substrate 111 may be directly formed on the outer surface 241 of the bottom cover plate 24, and the LED 112 is directly attached to the outer surface 241 of the bottom cover plate 24 and electrically connected to electrical circuits, whereby the substrate 111 can be omitted and a thermal resistance between the LED 112 and the bottom cover plate 24 due to the existence of the substrate 111 is eliminated. A layer of thermal interface material (TIM) may be applied between the substrate 111 and the outer surface 241 of the bottom cover plate 24 to eliminate an air interstice therebetween, to thereby enhance a heat conduction efficiency between the light source 11 and the bottom cover plate 24. Alternatively, the substrate 111 can be attached to the bottom cover plate 24 fixedly and intimately through surface mount technology (SMT).

Each of the top cover plate 25 and the bottom cover plate 24 is made of a metal having a high thermal conductivity, such as copper or aluminum. The tubular member 27 can be made of a metal or a non-metal material. When the tubular member 27 is made of a non-metal material, a total weight of the heat dissipation device 22 can be greatly reduced.

In operation, heat generated by the LED 112 is absorbed by the bottom cover plate 24. The heat of the LED 112 is rapidly transferred from the bottom cover plate 24 to the working fluid 28 in the evaporating chamber 261. The working fluid 28 absorbs latent heat and vaporizes into vapor in the evaporating chamber 261. The vapor floats upwardly from the evaporating chamber 261 and enters into the vapor passage channel 263. Then, the vapor floats along the vapor passage channel 263 and enters into the condensing chamber 262. The vapor in the condensing chamber 262 releases the latent heat carried thereby to the top cover plate 25 and the metal tube 221, and the latent heat is finally dissipated to ambient atmosphere by the metal fins 253, 222. After the vapor releases the latent heat, the vapor is condensed into condensate. The condensate is absorbed by the second porous wick 266 to enter into the condensate passage channel 264. The condensate is then drawn back to the evaporating chamber 261 via capillary forces provided by the second and the first porous wicks 266, 265, whereby the condensate is available again for a next phase change cycle in the evaporating chamber 261 and the heat of the LED 112 is thus continuously and effectively removed by the heat dissipation device 22.

The bottom plate 273 of the tubular member 27 is cone-shaped and tapered from the outer tube 271 towards the inner tube 272. The bottom plate 273 has a large bottom end 2731 connected with a bottom of the outer tube 271, and a small top end 2732 connected with a bottom of the inner tube 272. The large bottom end 2731 of the bottom plate 273 contacts with the first porous wick 265. The vapor in the evaporating chamber 261 is smoothly guided upwardly by the tapered bottom plate 273 into the vapor passage channel 263, and prevented from entering directly into the condensate passage channel 264, to thereby maintain a unidirectional movement of the working fluid 28 in the metal tube 221. A top end 2721 of the inner tube 272 extends upwardly beyond the top plate 274 into the condensing chamber 262. The top end 2721 blocks the condensate at the condensing chamber 262 from returning back to the vapor passage channel 263, to further maintain the unidirectional movement of the working fluid 28 in the metal tube 221.

Figure 4:
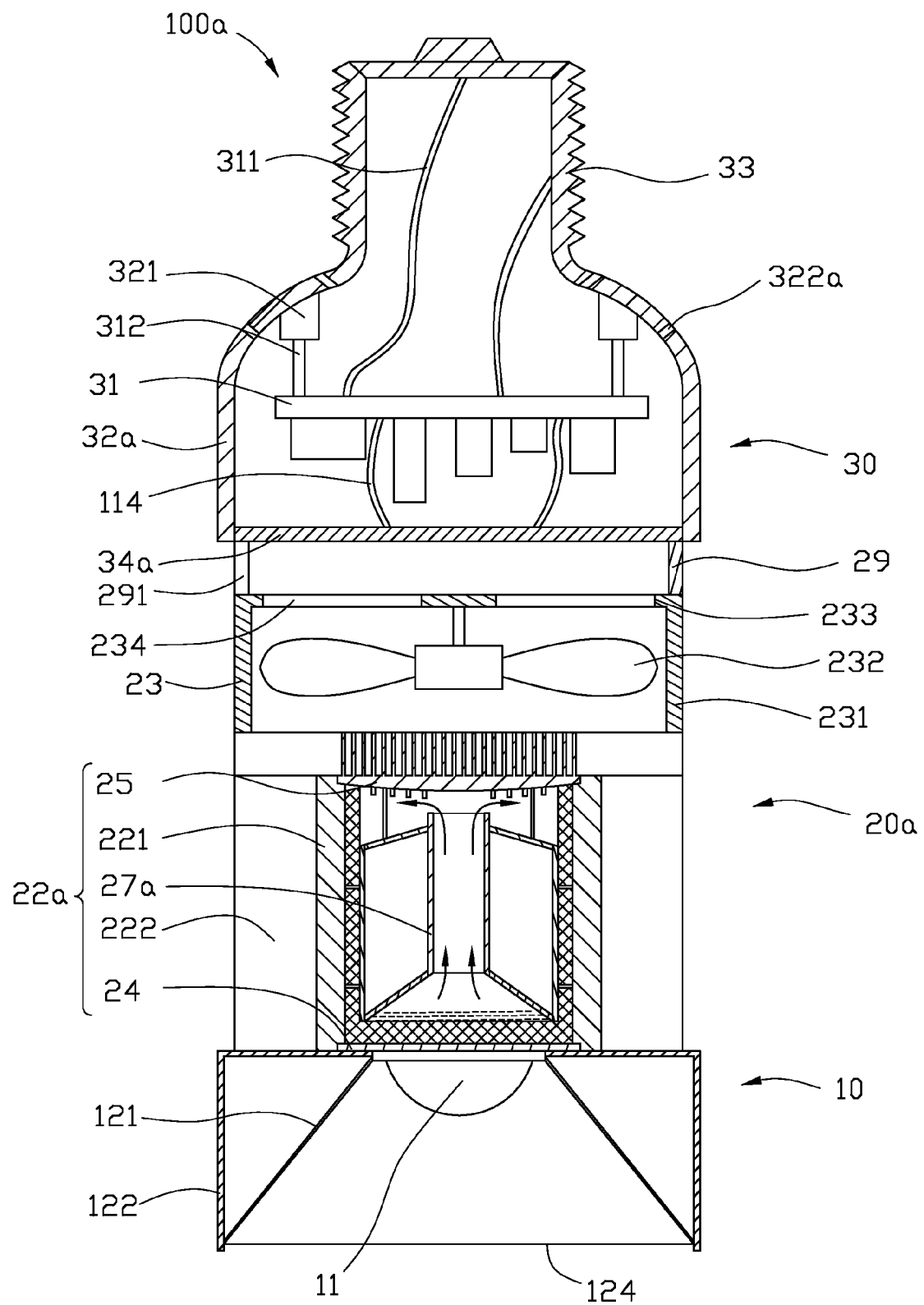
FIG. 4 is a cross-sectional view of an LED illuminating device in accordance with an alternative embodiment.

Referring to FIG. 4, an LED illuminating device 100a according to an alternative embodiment of the present disclosure is illustrated. Except the following differences, the LED illuminating device 100a of the present embodiment is essentially the same as the LED illuminating device 100 shown in FIG. 1. In the present embodiment, a cooling fan 23 is provided in the heat dissipation section 20a over the heat dissipation device 22a. The cooling fan 23 is located between the heat dissipation device 22a and the electrical section 30. The cooling fan 23 includes a fan housing 231 and a fan impeller 232 received in the fan housing 231. The fan impeller 232 is rotatably mounted to a mounting plate 233 of the fan housing 231. A plurality of air passage openings 234 are defined through the mounting plate 233. An annular spacer 29 is interposed between the cooling fan 23 and the partition plate 34a of the electrical section 30. A plurality of air passage openings 291 are defined through a circumferential periphery of the spacer 29. The air passage holes 322a defined through the casing 32a of the electrical section 30 have a size smaller than the air passage holes 322 of the previous embodiment.

Figure 5:
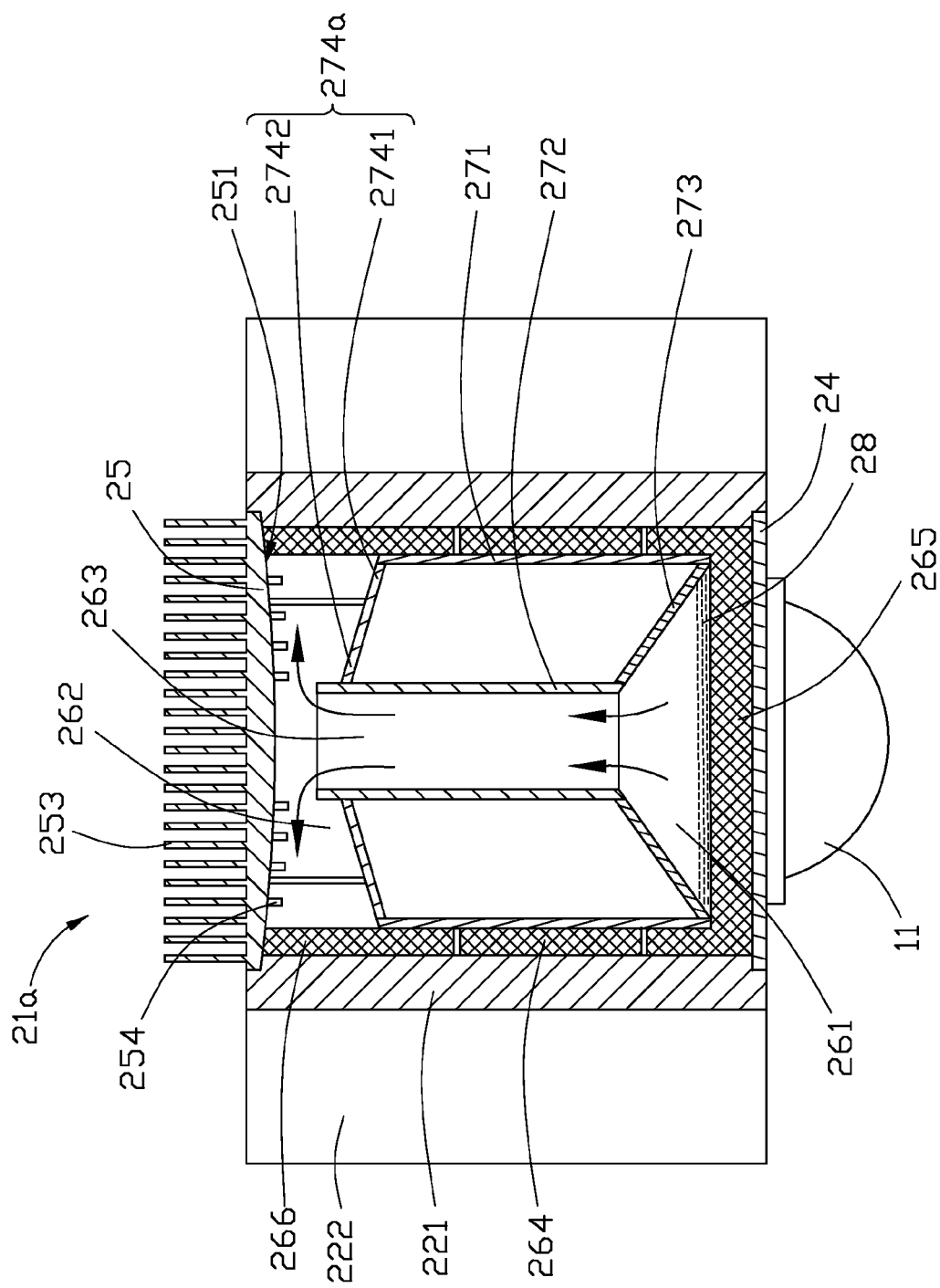
FIG. 5 shows a light engine of the LED illuminating device of FIG. 4.

Referring also to FIG. 5, the heat dissipation device 22a and the light source 11 cooperatively form a light engine 21a for the LED illuminating device 100a. A plurality of pin-shaped, metal fins 254 extends downwardly from the inner surface 251 of the top cover plate 25 into the condensing chamber 262, to increase a heat exchange surface for the vapor in the condensing chamber 262 with the top cover plate 25. The top plate 274a of the tubular member 27a is cone-shaped and tapered from the outer tube 271 towards the inner tube 272. The top plate 274a has a large bottom end 2741 connected with a top of the outer tube 271, and a small top end 2742 connected with a top of the inner tube 272. The condensate in the condensing chamber 262 is smoothly guided downwardly by the tapered top plate 274a into the condensate passage channel 264, to further maintain the unidirectional movement of the working fluid 28 in the metal tube 221.

The cooling fan 23 can be configured to begin operation as soon as the LED 112 starts emitting light. Alternatively, the cooling fan 23 can be automatically activated to rotate when a junction temperature of the LED 112 reaches a specified temperature value after the LED 112 has worked for a particular time period, and the cooling fan 23 does not operate when the junction temperature of the LED 112 is below the specified temperature value. When the cooling fan 23 does not operate, the heat of the LED 112 is mainly dissipated by the heat dissipation device 22a.

When the cooling fan 23 operates, the cooling fan 23 inhales air from the ambient atmosphere via the air passage openings 291 of the spacer 29. An airflow is then generated by the cooling fan 23 and flows towards the heat dissipation device 22a, whereby a forced air convection is circulated in the LED illuminating device 100a.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED illuminating device, comprising:
   an optical section being provided with a light source therein;
   an electrical section being electrically connected with the light source; and
   a heat dissipation section located between the optical section and the electrical section, the heat dissipation section being provided with a heat dissipation device, the heat dissipation device comprising a hollow metal tube, a bottom cover plate hermetically sealing a bottom of the metal tube, a top cover plate hermetically sealing a top of the metal tube, and a tubular member received in the metal tube, a plurality of metal fins extending upwardly from the top cover plate, the tubular member having a diameter smaller than the metal tube with a condensate passage channel defined between the metal tube and the tubular member, a bottom of the tubular member being spaced from the bottom cover plate with an evaporating chamber defined between the bottom of the tubular member and the bottom cover plate, a vapor passage channel being axially defined through a central portion of the tubular member, a top of the tubular member being spaced from the top cover plate with a condensing chamber defined between the top of the tubular member and the top cover plate, the vapor passage channel connecting the evaporating chamber with the condensing chamber, the condensate passage channel connecting the condensing chamber with the evaporating chamber, a working fluid being filled in the evaporating chamber, the light source being thermally attached to an outer surface of the bottom cover plate;
   wherein a first porous wick is received in the evaporating chamber and attached to the bottom cover plate, a second porous wick is filled in the condensate passage channel and connected with the first porous wick, and the working fluid is saturated in the first porous wick.

2. The LED illuminating device of claim 1, wherein the tubular member comprises an inner tube, an outer tube, a bottom plate and a top plate, the outer tube has a diameter greater than the inner tube but smaller than the metal tube, the inner tube, the outer tube and the metal tube are coaxially assembled to each other, the vapor passage channel is enclosed by the inner tube, the condensate passage channel is defined between the metal tube and the outer tube, the evaporating chamber is defined between the bottom plate and the bottom cover plate, and the condensing chamber is defined between the top plate and the top cover plate.

3. The LED illuminating device of claim 2, wherein the bottom plate of the tubular member is cone-shaped and tapered from the outer tube towards the inner tube.

4. The LED illuminating device of claim 2, wherein the top plate of the tubular member is cone-shaped and tapered from the outer tube towards the inner tube.

5. The LED illuminating device of claim 2, wherein a plurality of metal fins extends downwardly from an inner surface of the top cover plate into the condensing chamber.

6. The LED illuminating device of claim 2, wherein a top end of the inner tube extends upwardly beyond the top plate into the condensing chamber.

7. The LED illuminating device of claim 2, wherein a plurality of metal fins extends radially and outwardly from the metal tube.

8. The LED illuminating device of claim 1, wherein the condensate passage channel is annular and extends axially along an axial direction of the metal tube.

9. The LED illuminating device of claim 1, wherein the electrical section comprises a casing and a circuit board received in the casing, a plurality of air passage holes is provided through a circumferential periphery of the casing, and the light source is electrically connected with the circuit board.

10. The LED illuminating device of claim 1, wherein a cooling fan is provided over the heat dissipation device and configured to generate an airflow through the heat dissipation device, and the cooling fan is located between the heat dissipation device and the electrical section.

11. The LED illuminating device of claim 10, wherein a spacer is provided between the cooling fan and the electrical section, a plurality of air passage openings are defined radially through a circumferential periphery of the spacer, and the airflow flows through the air passage openings of the spacer.

12. A light engine of an LED illuminating device, comprising:
  a light source; and
  a heat dissipation device comprising a hollow metal tube, a bottom cover plate hermetically sealing a bottom of the metal tube, a top cover plate hermetically sealing a top of the metal tube, and a tubular member received in the metal tube, a plurality of metal fins extending upwardly from the top cover plate, the tubular member having a diameter smaller than the metal tube with a condensate passage channel defined between the metal tube and the tubular member, a bottom of the tubular member being spaced from the bottom cover plate with an evaporating chamber defined between the bottom of the tubular member and the bottom cover plate, a vapor passage channel being axially defined through a central portion of the tubular member, a top of the tubular member being spaced from the top cover plate with a condensing chamber defined between the top of the tubular member and the top cover plate, the vapor passage channel connecting the evaporating chamber with the condensing chamber, the condensate passage channel connecting the condensing chamber with the evaporating chamber, a working fluid being filled in the evaporating chamber, the light source being thermally attached to an outer surface of the bottom cover plate;
  wherein a first porous wick is received in the evaporating chamber and attached to the bottom cover plate, a second porous wick is filled in the condensate passage channel and connected with the first porous wick, and the working fluid is saturated in the first porous wick.

13. The light engine of the LED illuminating device of claim 12, wherein the tubular member comprises an inner tube, an outer tube, a bottom plate and a top plate, the outer tube has a diameter greater than the inner tube but smaller than the metal tube, the inner tube, the outer tube and the metal tube are coaxially assembled to each other, the vapor passage channel is enclosed by the inner tube, the condensate passage channel is defined between the metal tube and the outer tube, the evaporating chamber is defined between the bottom plate and the bottom cover plate, and the condensing chamber is defined between the top plate and the top cover plate.

14. The light engine of the LED illuminating device of claim 13, wherein the bottom plate of the tubular member is cone-shaped and tapered from the outer tube towards the inner tube.

15. The light engine of the LED illuminating device of claim 13, wherein the top plate of the tubular member is cone-shaped and tapered from the outer tube towards the inner tube.

16. The light engine of the LED illuminating device of claim 13, wherein a plurality of metal fins extends downwardly from an inner surface of the top cover plate into the condensing chamber, and a plurality of another metal fins extends radially and outwardly from the metal tube.

17. The light engine of the LED illuminating device of claim 13, wherein a top end of the inner tube extends upwardly beyond the top plate into the condensing chamber.

18. The light engine of the LED illuminating device of claim 12, wherein the condensate passage channel is annular and extends axially along an axial direction of the metal tube.

* * * * *